United States Patent [19]

Babich et al.

[11] Patent Number: 5,141,817
[45] Date of Patent: Aug. 25, 1992

[54] DIELECTRIC STRUCTURES HAVING EMBEDDED GAP FILLING RIE ETCH STOP POLYMERIC MATERIALS OF HIGH THERMAL STABILITY

[75] Inventors: Edward D. Babich; Michael Hatzakis, both of Chappaqua; Richard P. McGouey, Carmel; Sharon L. Nunes, Hopewell Junction; Jurij R. Paraszczak, Pleasantville, all of N.Y.; Jane M. Shaw, Ridgefield, Conn.

[73] Assignee: International Business Machines Corporation, Armonk, N.Y.

[21] Appl. No.: 366,089

[22] Filed: Jun. 13, 1989

[51] Int. Cl.$^5$ .............................................. B32B 9/04
[52] U.S. Cl. ........................... 428/447; 428/473.5; 428/689; 428/901; 528/10; 528/26; 528/27; 528/28; 528/37
[58] Field of Search ..................... 528/10, 26, 27, 28, 528/37; 428/473.5, 474.7, 901, 447, 689

[56] References Cited

U.S. PATENT DOCUMENTS

| | | |
|---|---|---|
| 2,739,638 | 5/1956 | Lewis et al. |
| 3,325,530 | 6/1967 | Wu |
| 3,440,191 | 4/1969 | Cuthill et al. |
| 3,445,495 | 5/1969 | Nelson ............................ 260/448.2 |
| 3,464,937 | 8/1969 | Bamford et al. |
| 3,687,995 | 8/1972 | Jones et al. .................... 260/448.2 |
| 3,694,427 | 8/1972 | Jonas et al. |
| 3,719,696 | 5/1973 | Jonas et al. .................... 260/448.2 |
| 4,795,680 | 1/1989 | Rich et al. ........................... 528/28 |
| 4,835,238 | 5/1989 | Burns ................................. 528/32 |

OTHER PUBLICATIONS

John Wiley & Sons, Editor: M. Grayson, D. Eckroth "Polyimides". Encyclopedia of Chemical Technology Third Edition pp. 704-719.

*Primary Examiner*—Merrell C. Cashion, Jr.
*Assistant Examiner*—D. S. Nakarani
*Attorney, Agent, or Firm*—Daniel P. Morris

[57] ABSTRACT

Structures containing a dielectric material having a polymeric reactive ion etch barrier embedded therein. The preferred dielectric materials are polymers, preferably polyimide materials. The RIE etch barrier is a copolymer having an aromatic component having high thermal stability and having a cross-linking component selected from metallacyclobutane, metallabutene and vinyl groups. The etch barrier is deposited as a solvent free liquid which can fill gaps between the dielectric material and electrical conductors embedded therein. The liquid polymer is cured to a solid insoluble state. The structures with electrical conductors embedded therein are useful for electronic applications.

15 Claims, 4 Drawing Sheets

DIELECTRIC STRUCTURES HAVING EMBEDDED GAP FILLING RIE ETCH STOP POLYMERIC MATERIALS OF HIGH THERMAL STABILITY

FIELD OF THE INVENTION

This invention relates to dielectric structures having imbedded therein a polymeric material which is resistant to reactive ion etching. In particular, this invention relates to polyimide structures for electronic applications. More particularly, this invention relates to polyimide structures, for electronic applications, having electrical conductors embedded therein and a polymeric layer which is resistant to reactive ion etching, which has high thermal stability and which is capable of filling gaps between the electrical conductors and the polyimide structure.

BACKGROUND OF THE INVENTION

In electronic applications multi-level polymer structures are being increasingly used, for example, as the top metallization structures of semiconductor chips, semiconductor chip packaging substrates and as independent structures for electrically interconnecting a semiconductor chip to a semiconductor chip substrate. These multi-level polymer structures are used since they can be fabricated independently of the structure on which they are disposed. For example, a semiconductor chip, or a semiconductor chip packaging substrate can be fabricated to a level having a predetermined terminal electrical conductor pattern. A multi-level polymer structure can be fabricated having on a first side an electrical conductor pattern corresponding to the terminal electrical conductor pattern of the chip or substrate. On a second side of the multi-level polymer structure a variety of terminal or input/output conductor patterns can be fabricated. An easily implemented and inexpensive personalization of the semiconductor chip or semiconductor chip packaging substrate is provided by disposing the first side of the multi-level polymer structure onto the chip or substrate.

Semiconductor chip packaging substrates are typically made from ceramic materials having multi-level conductor patterns therein. Electrical conducts in the upper levels are used to electrically interconnect the substrate to the input/output terminals of the semiconductor chip mounted thereon. Therefore, the upper levels require a denser electrical conductor pattern than other levels in the substrate. Patterns of finer dimensions can be fabricated in polymer materials than in the ceramic materials. Therefore, the use of multi-level conductor polymer structures permits the terminal metallization layers of a semiconductor chip packaging substrate to have electrical conductors which have smaller dimensions and which are more closely spaced than is capable of being fabricated in the ceramic material of a ceramic semiconductor chip substrate.

A multi-level polymer structure is typically fabricated by providing a first polymer layer using standard photolithography techniques forming a pattern of through-holes therein which are filled with an electrically conducting material. A second polymer layer is deposited thereover. A resist like material is deposited onto the second polymer layer. The resist like material is patterned and developed exposing regions of the second polymer layer. The exposed polymer regions can be etched by a chemical etchant or a dry etchant, such as, as a reactive ion (RIE) or plasma etchant. For the purpose of this application RIE and plasma etching are synonymous. RIE etching is the preferred etchant since it provides straighter sidewalls to the pattern etched in the polymer layer and thereby forms a pattern having smaller dimensions. The RIE etches down through the second polymer layer and reaches the top surface of the first polymer layer. The RIE etching can be timed in order to stop it at the appropriate depth. Timing the RIE etch results in a variable depth of the etched pattern. The variation in the depth is determined by the accuracy of the timing of the etching as well as statistical variations in the RIE etch parameters. The variation in the etched depth can be eliminated if an RIE etch barrier is provided between the first and second polymer layer. As a pattern is RIE etched in the second polymer layer, the RIE etching stops at the etch barrier, thereby the etched depth is accurately controlled.

The inventions herein are not limited to RIE etch barriers embedded within polymer materials but is generally applicable to such barriers embedded in a dielectric material.

It is an object of this invention to provide a dielectric body having an RIE etch barrier embedded therein.

Multi-level polymer structures used in electronic applications are cycled up to relatively high temperatures, for example, in excess of 400° C. Therefore, RIE etch barrier disposed within a multi-level polymer structure should have high thermal stability.

It is another object of this invention to provide a polymer body having an RIE etch barrier embedded therein.

It is another object of this invention to provide a polymer body having an RIE etch barrier embedded therein which is useful for electronic applications.

It is another object of this invention to provide a polymer body with an RIE etch barrier embedded therein which has high thermal stability.

When an electrical conducting material is deposited into a pattern etched in a dielectric layer, typically there are spaces between the sidewall of the pattern in the dielectric material and the electrical conductor formed therein. Such spaces provide regions where contaminants, for example, created during the processing of the substrate, can accumulate. Contaminants such as ionic contaminants can create electrical short circuits between electrically conducting lines and can result in corrosion of the electrically conducting lines which can result in electrical opens. It is desirable to fill these spaces or gaps to avoid these undesirable effects.

The RIE etch barrier according to the present invention is deposited as a liquid polymer which has a viscosity sufficient to permit the polymer to flow into into the gaps between the electrical conductors and the etched pattern in the dielectric material. The liquid polymer is thereafter cured to cross-link the polymer to a solid state.

It is an object of this invention to provide a polymeric material which fills the gaps between the electrical conductors and the dielectric body within which it is embedded.

Polymeric materials according to the present invention which simultaneously act as a RIE etch barrier and are capable of filling these gaps are formed from a copolymer, one unit of which has high temperature stability and at least one other unit of which is capable of cross-linking the polymer.

It is another object of this invention to provide a polymeric material having a high thermally stable component and a component permitting cross-linking.

RIE etching of substrates for electronic applications frequently use oxygen containing RIE etches. Prior art materials which an artisan might suspect would provide a high resistance to an oxygen RIE or plasma etch suffer from several inadequacies. In the liquid state they have high viscosity mitigating against their ability to fill the gaps, they have low resistance to the oxygen plasma or they have a low thermal stability precluding their use in a high temperature cycling environment such as required as an intermediate layer in a dielectric structure for electronic applications. The RIE etch barrier materials according to the present invention surmount these problems by having a low viscosity and being free of solvents which reduces the problems of shrinkage on curing and by having a high etch resistance with respect to the dielectric body.

SUMMARY OF THE INVENTION

In its broadest aspect this invention is a dielectric body having embedded therein polymer body which is a barrier to reactive ion etching.

In a particular aspect of the present invention, the polymer etch barrier body is a cross-linked form of a copolymer containing silicon, germanium or transition metal, containing an aromatic constituent having high thermal stability and containing a cross-linking constituent selected from a cyclobutane radical and a vinyl radical.

In a more particular aspect of the present invention, the aromatic constituent having high thermal stability is selected from the group of substituted or unsubstituted naphthalene, anthracene, adamantive radicals, ferreceric and carborane radicals.

In a more particular aspect of the present invention the polymer body is a polyimide body.

In another more particular aspect of the present invention the polymer body has embedded therein electrical conductors.

In another more particular aspect of the present invention, the polymer body has at least one cavity in the dielectric body extending to the reactive ion etched barrier body.

In another more particular aspect of the present invention, the cavity is filled with an electrical conductor.

In another more particular aspect of the present invention, the RIE etch barrier material fills gaps between the electrical conductor the sidewall of the opening in the dielectric body.

In another more particular aspect of the present invention, the dielectric body having electrical conductors embedded therein is a substrate on which an electronic device is electrically mounted.

In another more particular aspect of the present invention, the polymer body having electrical conductors embedded therein is the top surface metallization of an electronic device.

In another more particular aspect of the present invention, the copolymer has structural formula:

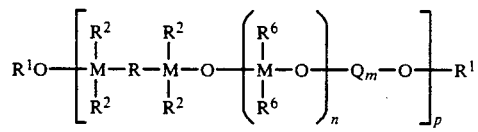

wherein Q is selected from the group consisting of groups having structural formula:

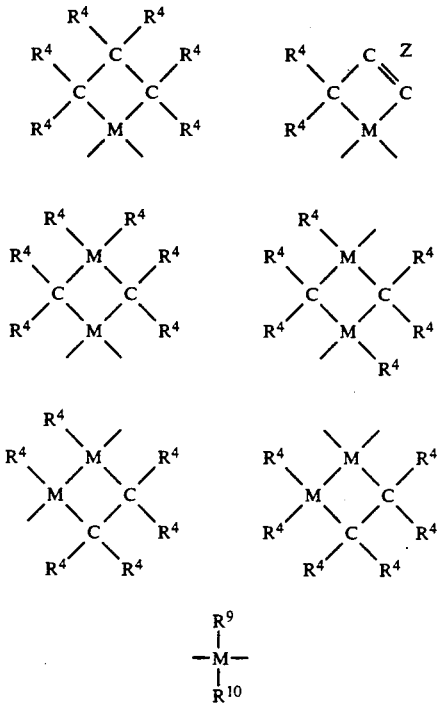

where R is a divalent aromatic radical;

wherein $R^1$ is selected from the group consisting of H, a monovalent hydrocarbon radicals and a silyl radical having structural formula:

wherein each $R^2$ is selected from the group consisting of H and monovalent vinyl and alyl radicals preferably alkyl, alkenyl and aryl radicals;

wherein each $R^4$ is selected from the group consisting of H, a monovalent hydrocarbon radical and a silicon containing radical having structural formula:

$$-\underset{\underset{R^5}{|}}{\overset{\overset{R^5}{|}}{Si}}-R^5$$

wherein for the cyclobutane groups Q containing adjacent M atoms, $R^4$ is preferably an organic radical such as methyl or larger than methyl;

wherein each $R^5$ is selected from the group consisting of hydrogen, an alkyl radical and an aryl radical;

wherein each $R^6$ is selected from the group consisting of monovalent hydrocarbon radicals, preferably alkyl and alkenyl radicals;

wherein $R^9$ is selected from the group consisting of monovalent hydrocarbon radicals;

wherein $R^{10}$ is selected from the group consisting of alkenyl radicals;

wherein Z is selected from the group consisting of aromatic radicals, preferably being phenylene, naphthalene and anthracene wherein Z forms a six member carbon ring with the two $R^4$ to which is bonded;

wherein each M is selected from the group consisting of Si and Ge;

wherein P has a value such that said compound has a molecular weight from about 1,000 to about 30,000;

wherein m is at least 1; and wherein n is greater than or equal to 0.

These and other objects, features and advantages will be apparent from the following more particular description of the preferred embodiments and the figures appended thereto.

DETAILED DESCRIPTION OF THE PREFERRED EMBODIMENTS

FIG. 1 to FIG. 9 schematically show a process to fabricate a structure according to the present invention.

Figure 1:
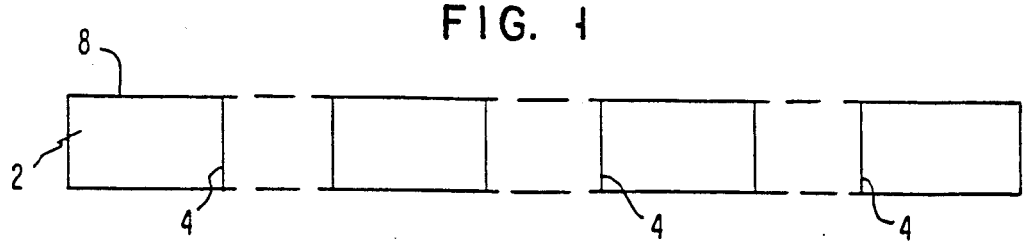
FIG. 1 shows a dielectric layer with through-holes therein.
Figure 2:
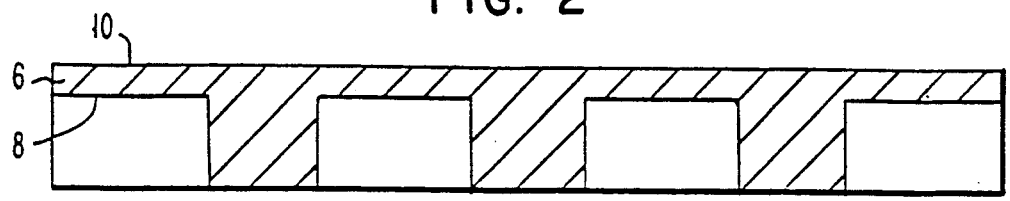
FIG. 2 shows electrically conductive layer disposed over the structure of FIG. 1.

In FIG. 1 dielectric layer 2 has through-holes 4 fabricated therein. The through-holes can be fabricated by methods commonly used in the art, for example, wet etching, dry etching, punching and drilling and the like. When wet or dry etching is used to fabricate the through-holes, a resist-like material is disposed on one surface of the dielectric layer 2. The resist-like layer is typically a photoresist, for example, AZ type photoresist manufactured by Shipley. The photoresist is exposed through a mask to electromagnetic radiation, for example, light and the exposed patterns on thereafter developed. The exposed regions of the dielectric are thereafter wet or dry etched to etch the through-holes 4 in the dielectric layer 2. As shown in FIG. 2 an electrically conducting layer 6 is deposited over surface 8 of the patterned dielectric 2 of FIG. 1.

Figure 3:
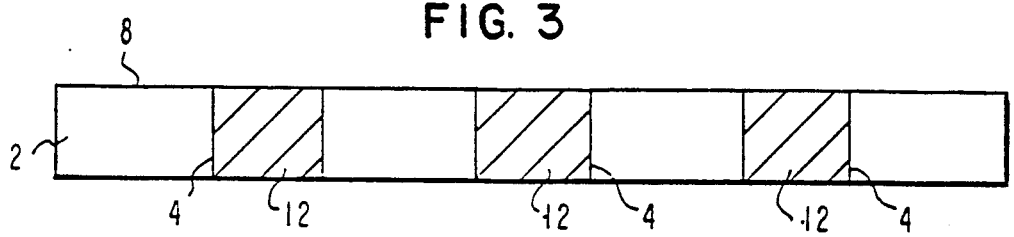
FIG. 3 shows the electronically conductive layer of FIG. 2 etch back to the top surface of the dielectric layer.

As shown in FIG. 3 surface 10 of electrically conducting layer 6 is etched back, by methods commonly known in the art, to surface 8 of the dielectric layer 2 leaving through-holes 4 filled with electrically conducting material 10 to form electrically conducting vias 12.

Figure 4:
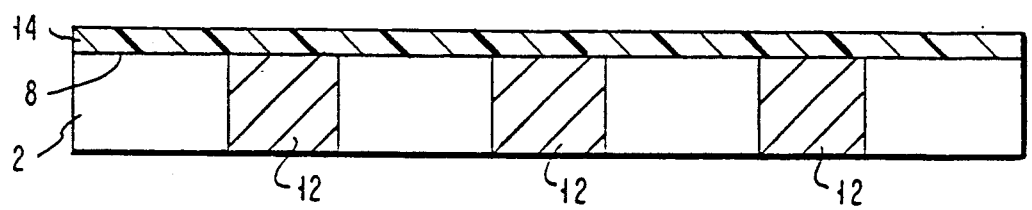
FIG. 4 shows the structure of FIG. 3 with a layer of material forming an RIE etch barrier according to the present invention.

As shown in FIG. 4 RIE etch barrier layer 14 is disposed on surface 8 of polymer layer 2.

Figure 5:
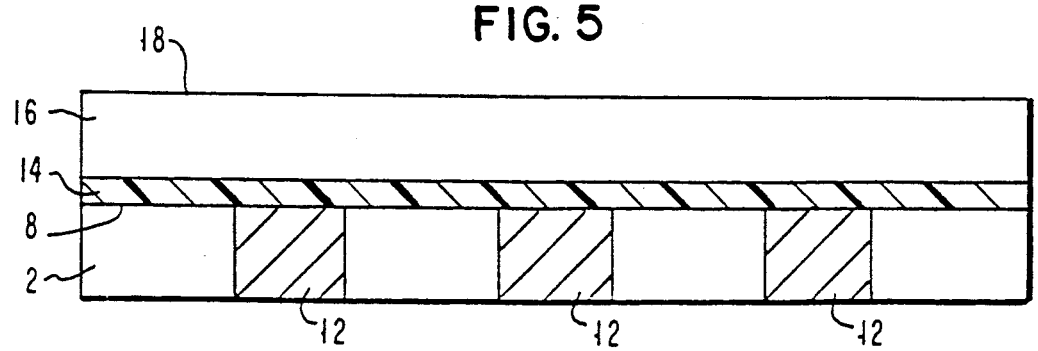
FIG. 5 is the structure of FIG. 4 with a dielectric layer disposed onto the RIE etch barrier of FIG. 4.

As shown in FIG. 5 a second dielectric layer 16 is disposed onto RIE etch layer 14.

Figure 6:
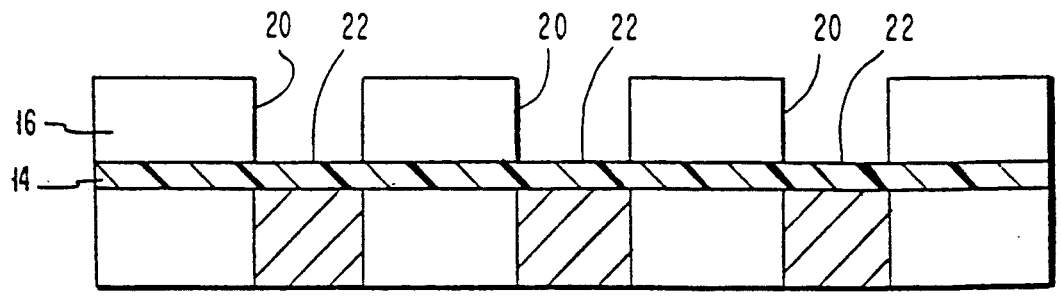
FIG. 6 shows selective removal of the dielectric of the second dielectric layer of FIG. 5.

By methods commonly known in the art, a resist-like material is disposed onto surface 18 of dielectric layer 16. The resist-like material is typically a photoresist which is exposed to electromagnetic radiation, for example, visible light, to form a pattern in the photoresist. The pattern is developed and removed leaving a photoresist mask on surface 18. The exposed regions of dielectric layer 16 are then exposed to an RIE etch or a plasma etch which attacks the exposed regions of dielectric layer 16 etching through dielectric layer 16 down to the RIE etch barrier 14 as shown in FIG. 6 forming pattern 20 in dielectric layer 16. For the purpose of this application RIE etch and plasma etch are synonymous. Exposed regions 22 of the RIE etch barrier 14 are removed as will be described hereinbelow. The resulting structure shown in FIG. 7 has a pattern 20' through dielectric layer 16 and etch barrier 14 exposing surface 22 of electrically conducting pattern 12 in dielectric 2.

Figure 7:
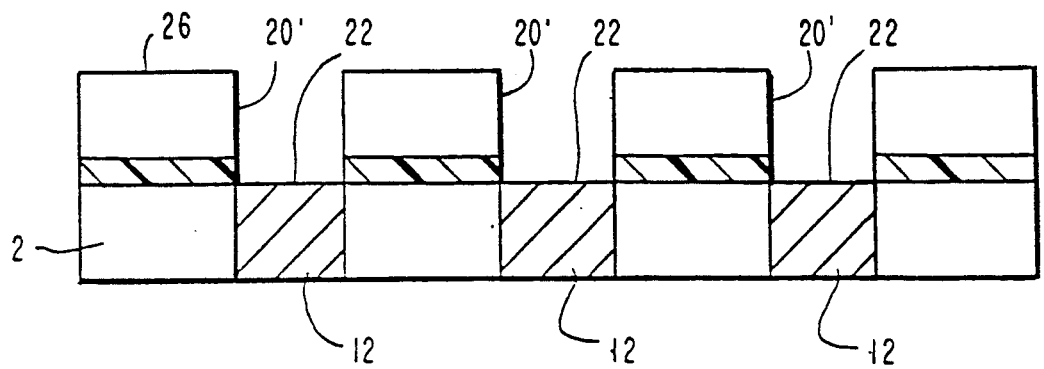
FIG. 7 shows the RIE etch barrier removed at the bottom of the second dielectric layer where the second dielectric has been removed.
Figure 8:
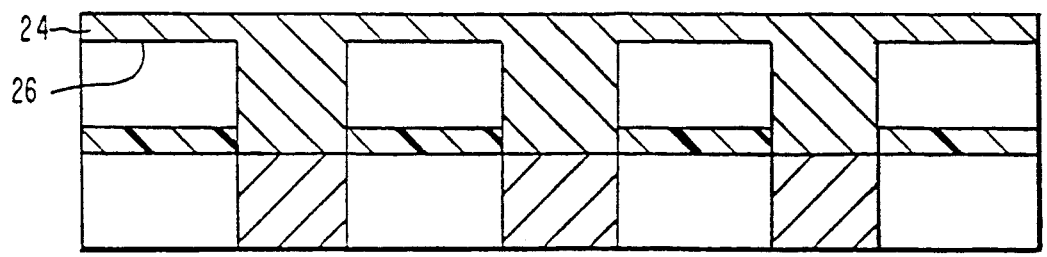
FIG. 8 shows an electrically conductive layer disposed over the structure of FIG. 7.

As shown in FIG. 8 a second electrically conducting layer 24 is deposited over surface 26 of the structure of FIG. 7. Electrically conducting layer 24 can be deposited by any means commonly known in the art such as sputter deposition, chemical vapor deposition, electroplating, electroless-plating and the like. The electrically conducting layer 24 is etched back to surface 26 of dielectric layer 16 resulting in the structure shown in FIG. 9.

Figure 9:
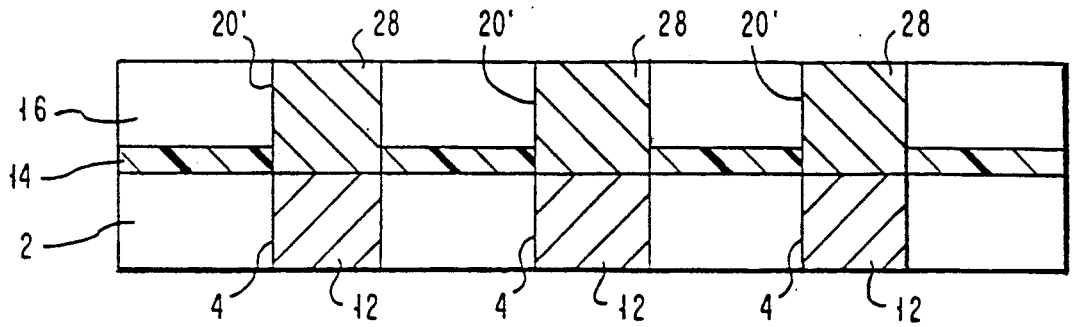
FIG. 9 shows the electrically conductive metal layer of the structure of FIG. 8 etched back to the top surface of the second dielectric layer.

FIG. 9 shows pattern 20' through dielectric layer 16 and RIE etch barrier 14 filled with electrically conducting material 28 which are in electrical contact with electrically conducting material 12 in through-holes 4 in dielectric layer 2.

It will be recognized by those of skill in the art that a structure having any number of dielectric and electrically conductive layers can be fabricated by repeating the steps of FIG. 1–9. The fabrication of the structure of FIG. 9 has been described in terms of forming dielectric layer having electrically conducting vias and another dielectric layer having conductors. Any number of layers having electrically conductive vias or electrical conductors or any combination thereof can be fabricated by the method described herein.

The methods and structures described with reference to FIG. 1 to FIG. 9 are exemplary only and not limiting.

Dielectric materials for layers 2 and 16 of the structure of FIG. 9 can be ceramics and polymers. The preferred dielectric materials are polymers. The most preferred dielectric material is a polyimide material. The electrically conducting material used to form electrical conductors 12 and electrical conductors 28 can be any electrically conducting material. The preferred electrically conducting materials are metals. The most preferred electrically conducting materials are copper, aluminum, molybdenum, chromium, gold, silver and alloys thereof. The RIE etch used to fabricate patterns in the dielectric layers are preferably oxygen containing. The most preferred RIE or plasma etch is O₂ and O₂/CF₄. Dielectric layers in the structure of FIG. 9 can have any thickness, the preferred thickness is from about 1 micron to about 10 microns. The RIE etch barrier layer 14 can have any thickness, the preferred thickness is from about 0.2 microns to about 1 micron.

The RIE etch barrier material 14 of FIG. 9 is a copolymer containing a unit having high thermal stability and a unit capable of cross-linking with other molecules of the copolymer. The RIE etch barrier layer 14 is deposited onto surface 8 of FIG. 4 as a liquid copolymer which is there after cured to cross-link the polymer to form the RIE etch barrier layer 14. The liquid copolymer has a molecular weight between about 1000 to about 30,000, this provides a sufficiently low viscosity so that the liquid polymer can flow into gaps 30 shown in FIG. 10 between electrical conductors such as 12 and sidewall 32 of through-hole 4 of dielectric layer 2.

Figure 10:
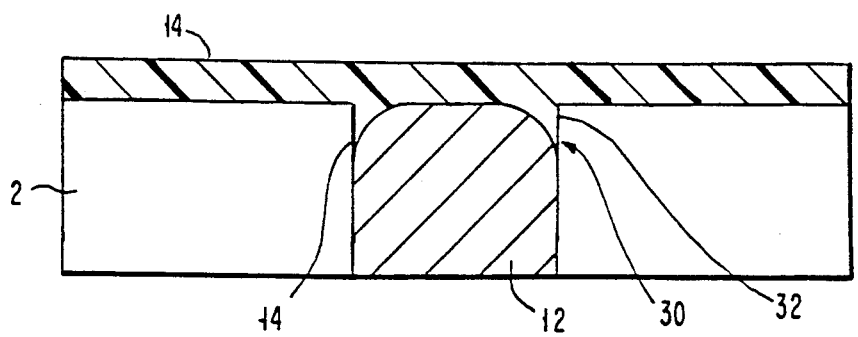
FIG. 10 is an expanded view of one of the electrical conductors in the structure of FIG. 3 showing the polymeric etch barrier material filling in gaps between the electrical conductor and the first dielectric layer.

It is desirable to fill in gaps between the electrical conductors and the dielectric layer within which it is embedded since gaps provide regions which can trap contaminants within the structure of FIG. 10. These contaminants can be chemicals used during the processing of the structure of FIG. 10 or residues of the RIE etching or photoresist polymers used in the processing as well as other materials. Contaminants can introduce ions which can result in electrical short circuits between otherwise electrically isolated electrical conductors or can provide a source of corrosion of the embedded electrical conductors.

According to one aspect of the present invention, a liquid copolymer precursor of the RIE etch barrier 14 of FIG. 9 is formed by reacting a disilyl or digerma substituted compound having high thermal stability represented by the following structural formula:

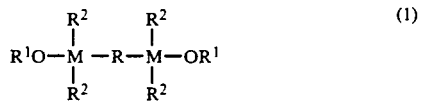

with a cyclobutane having structural formula:

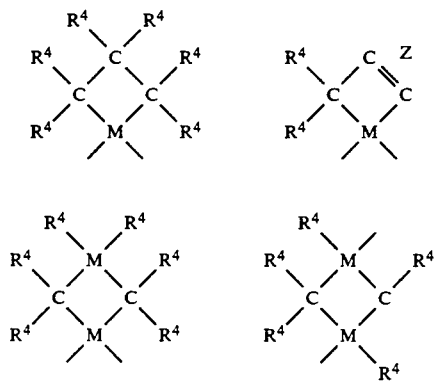

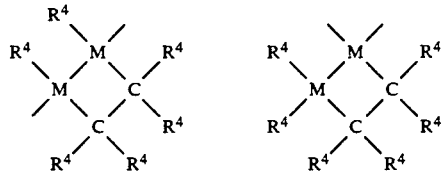

wherein each M is selected from the group of silicon and germanium;

wherein R is a bivalent aromatic compound preferably selected from the group consisting of a substituted or unsubstituted phenyl radical, a substituted or unsubstituted naphthalene radical, a substituted or unsubstituted anthracene radical, a substituted or unsubstituted adamantine radical, a substituted or unsubstituted ferrocene radical, and a substituted or unsubstituted carborane radical, wherein the most preferred bivalent radical is an unsubstituted phenyl radical;

wherein $R^1$ is a monovalent radical selected from the group of hydrogen, alkyl, aryl and alkenyl, $R^1$ is preferably hydrogen;

wherein each $R^2$ is a monovalent radicals each being selected from the group consisting of hydrogen, monovalent alkyl, aryl and alkenyl radicals and a siloxy radicals, wherein $R^2$ is preferably methyl and wherein the siloxy radical has the following structural formula:

wherein each $R^5$ is selected from the group consisting of an alkyl radical, an aryl radical and an alkenyl radical;

wherein each $R^4$ is selected from the group consisting of hydrogen, an alkyl radical, an aryl radical, an alkenyl radical and a silyl radical having structural formula:

$R^4$ is preferably an alkyl radical, most preferably a methyl radical;

wherein Z is selected from the group consisting of aromatic radicals, preferably substrated and unsubstrated phenylene, naphthalene and anthracene, wherein Z forms a six memebered carbon ring with the two $R^4$ to which it is bonded wherein Z can be, for example —$R^{15}C$=$R^{16}C$—$R^{17}C$=$R^{18}C$— wherein $R^{15}$, $R^{16}$, $R^{17}$ and $R^{18}$ are organic radicals;

wherein $R^5$ is a monovalent radical selected from aryl, alkyl and alkenyl radicals;

wherein M is selected from the group consisting of silicon and germanium atoms;

wherein X is an anionic leaving group selected from the group consisting of halide ions, most preferably chlorine ions.

In a solvent approximately equimolar amounts of the substituted aromatic compound of equation 1 is mixed with the cyclobutane compound of equation 2 with approximately twice the number of moles of a HCl acceptor, e.g., pyridines, triethylamine and the substituted aminies, to result in a copolymer having structural formula:

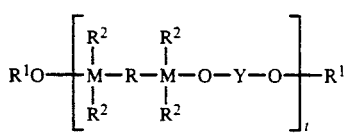
(4)

wherein Y is one of the bivalent radicals of equation 2.

Typical solvents are tolyene, xylene, diglyme, amylacetate, tetrahydrofurane.

The value of t depends on the desired molecular weight. The molecular weight of the condensation product of equation 4 depends upon the reaction conditions and can be regulated to be in the range from about 1,000 to about 30,000 liquid oligomers. It will be recognized by an artisan that molecular weight can be controlled by the type of HCl accepter, reaction time, type of solvent and concentration of components.

The structure of the oligomers (equation 4) contain the reactive metallocyclobutane ring which can undergo thermal or catalytic polymerization forming cross-linked insoluble products from the condensation product of equation 4. In the preferred embodiment a catalyst is not used.

In the preferred embodiment the substituted aromatic compound of equation 1 is a disilyl substituted compound, being most preferably bis(hydroxydimethylsilyl)benzene. A metallocyclobutane of equation 2 preferably contains silicon, being most preferably, 1,1-dichloro-1-silacyclobutane. The condensation product of equation 4 formed from the most preferred compounds of equations 1 and 2 can be thermally cross-linked at a temperature from between about 170° C. to about 210° C. in from about 15 to about 30 minutes. If 1,1-dichloro-3,3-dimethyl-1,3-disilacyclobutane is used instead of 1,1-dichloro-1-silacylcobutane to prepare an oligomer according to equation 4, the cross-linking temperature can be reduced to 80°-100° C.

The molecular weight of the product of equation 4 is adjusted to be in the range from about 1,000 to about 30,000 liquid oligomers so that the liquid polymer will have a sufficiently low viscosity to fill the gaps between the electrical conductors and dielectric substrate within which it is embedded. The condensation product of equation 4 forming the liquid polymer is separated from the solvents by commonly used techniques.

As shown in the following sequence of equations, heat H is supplied to the liquid polymer of equation 4 resulting in the opening of the metallocyclobutane ring via a bipolar intermediate resulting in cross linking of the material and possible grafting to the polymeric substrate, for example polyimide, as shown in equation 6.

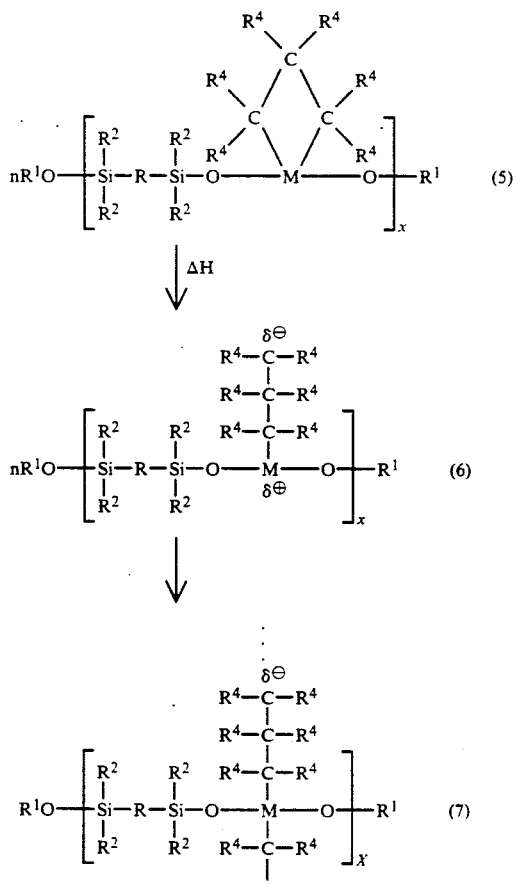

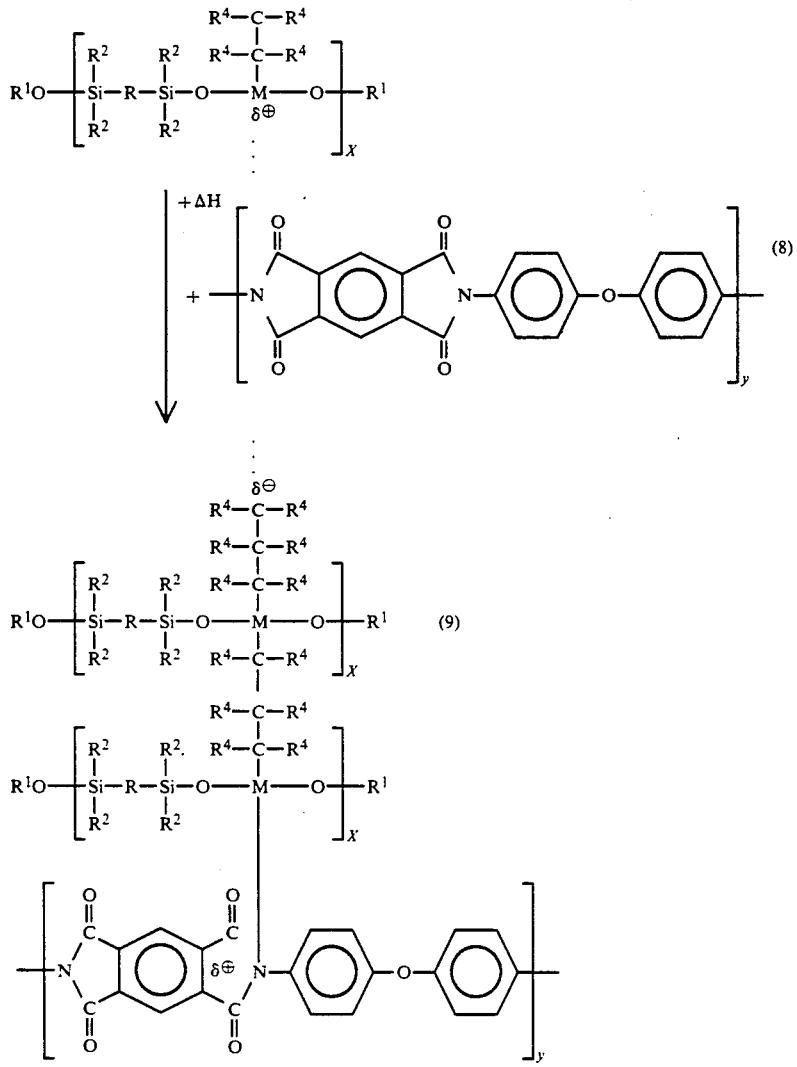

A catalyst is not necessary to open the cyclobutane ring. It is believed that cross-linking occurs from the chemical interaction of the positive end of the open ring on one molecule of equation 6 with the negative end of the open ring of another molecule of equation 6. Equation 7 shows the cross-linking with only two molecules being cross-linked. The three dots occurring in two locations in equation 7 indicates further cross-linking with molecules of equation 6. Polymerization chain termination of the bipolar intermediate of equation 6 can result in grafting of the cross-linked polymer of equation 7 to a substrate on which it is deposited. In the preferred embodiment the substrate is a polymer, most preferably a polyimide. Polyimide materials contain an imide functionality which has a cyclic ring which can be opened upon the application of heat. As represented by equation 8, when the polymer of equation 6 is deposited on a PMDA-ODA polyimide and heated to cross-link the polymer of equation 6, the imide ring of the polyimide opens resulting in the structure of equation 9 wherein the cross-linked polymer is grafted to a nitrogen atom in the open imide ring of the polyimide material. About 210° C. is sufficient to open the PMDA-ODA imide ring.

The polyimide is not limited to PMDA-ODA (pyromelaicdianhydride oxydianiline). The Encyclopedia of Chemical Technology, Third Edition in the article entitled "Polyimides", Vol. 18, pp. 702–719, the teaching of which is incorporated herein by reference, describes various polyimide materials including homopolymers.

Enhanced adhesion of the RIE etch barrier to a polymer substrate can be achieved by treating the polymer substrate to a water vapor plasma prior to disposing the liquid polymer, which forms the RIE etch barrier, thereon. Details on using a water vapor plasma to promote the adhesion of a first and second polymer layer can be found in copending U.S. patent application Ser. No. 07/3,326,56 filed Apr. 3, 1989 entitled "Method for Enhancing the Adhesion of Polymer Surfaces by Water Vapor Plasma Treatment" to Chou et al., the teaching of which is incorporated herein by reference.

The degree of cross-linking can be regulated by regulating the amount of the cyclobutane groups in the oligomer of equation 5 by substituting the cyclobutance groups with some other difunctional nonreactive groups.

This can be accomplished, for example, by adding to a solvent a halide acceptor, k molecules of the compound of equation 1, p molecules of the compound of equation 2 and n molecules of the compound having the following structural formula:

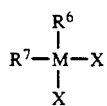  (10)

wherein M is as defined above and wherein $R^6$ and $R^7$ are selected from the group of alkyl and alkenyl radicals. The product is the terpolymer shown in equation 11 wherein Y is one of the bivalent radicals of equation 2.

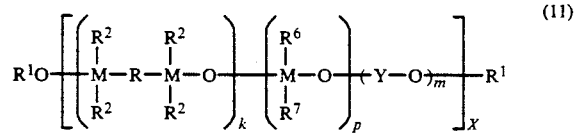  (11)

It will be apparent to an artisan that the ratio of k to p to m is controlled by concentration of the constituents used to fabricate the compound of equation 11. For example, k=10, p=10 and m=1 when 10 moles of bis (hydroxydimethylsilyl) benzene, 10 moles of dimethyldichlorosilane and 1 mole of 1,1-dichiro-1-silacyclobutane is reacted in a solvent containing a pyridines as HCl acceptor.

The terminal $OR^1$ groups of equation 6 and 11 can be substituted by triarylsilyl groups if an excess of the monofunctional monomer having structural formula:

  (12)

is used in the starting reaction mixture to fabricate the structure of equation 5 and equation 11. M and X are as defined above and each $R^8$ is selected from the group of aryl and alkyl radicals. The most preferred monofunctional monomer is trimethylchlorosilane.

The cross-linking constituent of polymer of equation 5 and equation 11 is a metallocyclobutane ring. A vinyl containing compound can replace a metallocyclobutane as the cross-linking agent of equation 10 and equation 3. The vinyl compound has structural formula:

  (13)

wherein at least one of $R^9$ and $R^{10}$ is an alkenyl radical containing at least one carbon carbon double bond, being most preferably an ethelene radical. If only one of $R^9$ or $R^{10}$ contains a carbon carbon double bond, the other can be an alkyl or aryl radical.

As shown in the following sequence of equations, in a solvent containing a halide acceptor, approximately equimolar amounts of the compound of equation 13 is combined with the compound of equation 1.

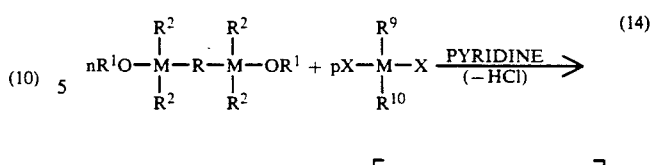  (14)

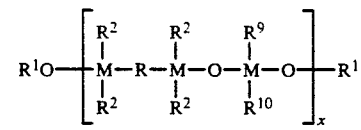

The product of equation 14 corresponds to equation 5 with the cyclobutane ring replaced with the vinyl containing group of equation 13, wherein constituents R, $R^1$, $R^2$, $R^9$, $R^{10}$ and M are defined hereinabove.

Equation 15 corresponds to equation 11 with the cyclobutane ring replaced by the vinyl containing group of equation 13, wherein constituents R, $R^1$, $R^2$, $R^6$, $R^7$, $R^9$ $R^{10}$, M, K, P, M and are deferred above.

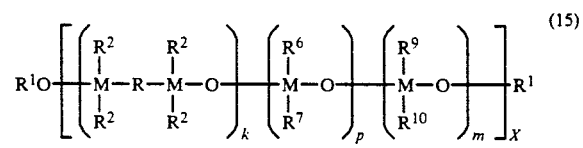  (15)

Cross-linking of the polymers of equation 14 and equation 15 generally will require either a photo-initiator or a thermal initiator to open up the carbon carbon double bond. An example of a radical photoinitiator is IRGACURE (manufactured by Ciba-Geigy) which is added up to 10% by weight of polymers of equation 14 and equation 15. The mixture of the polymer of equation 14 or equation 15 and the radical photo-initiator is irradiated with light for example, at frequency 248 mm when IRGACURE is used as the photo-initiator. Alternatively, a thermal radical initiator just requires heat to open the vinyl carbon carbon double bond. Examples of thermal initiators are, AIBN (manufactured by Aldrich Chemical Co.) or azobisisobutyrolnitrile, which requires greater than about 60° C. to polymerize carbon-carbon double bonds.

The following equation 16 represents the cross-linked product of equation 15 when $R^9$ is ethylene radical and $R^{10}$ is methyl radical. In the preferred embodiment the compound of equation 15 is a vinyl containing silphenylenesiloxane oligomer.

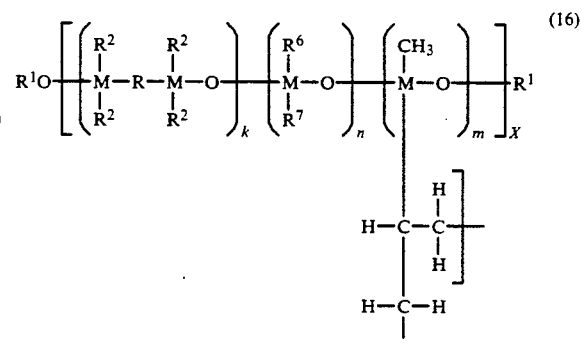  (16)

-continued

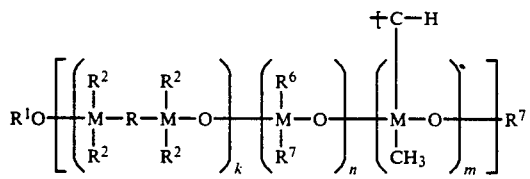

Figure 11:
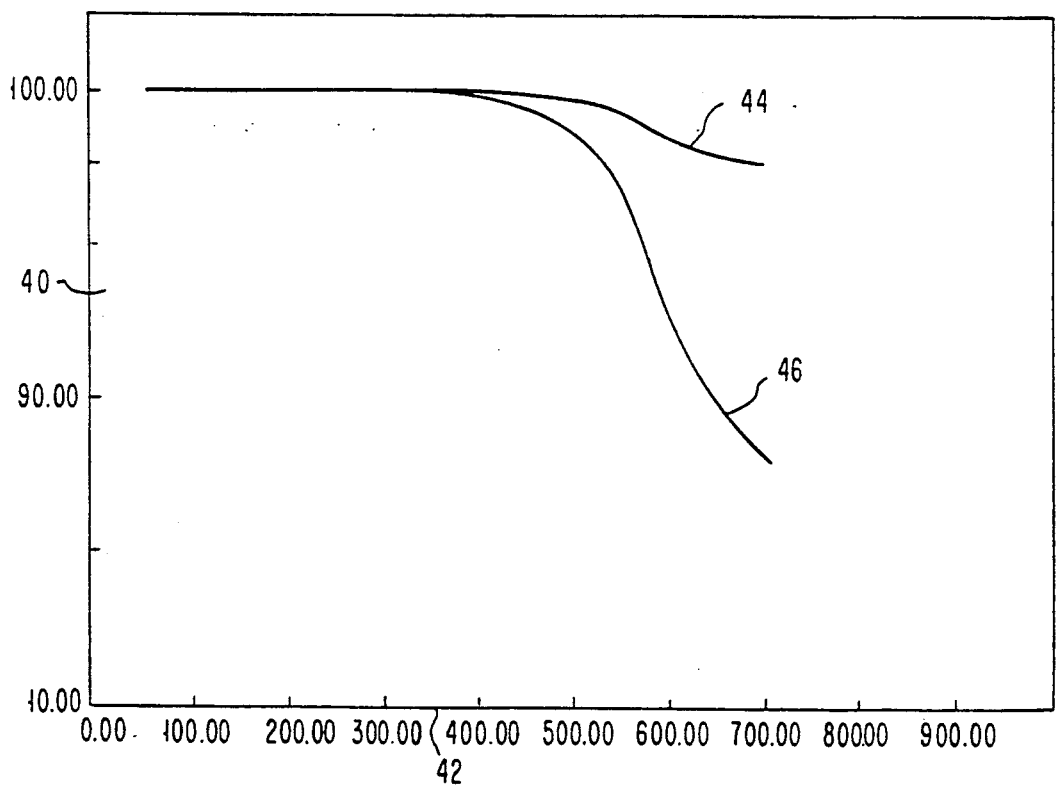
FIG. 11 is a plot of a thermogravimetric analysis of an RIE etch barrier polymer of the present invention.

Materials of the equations 5, 11, 14 and 15 can be used as RIE barrier layers. When exposed to an an oxygen containing plasma the organic constituents are oxidized into volatile compounds leaving and oxides of the M, e.g. silicon oxides, constituent which are not volatile. (When required, these materials can be removed by etching in flourine-containing plasmas). All of these materials have high thermal and thermo-oxidative stability. For example, in FIG. 11 is shown a thermogravimetric analysis (TGA) of a disilylphenylene silacyclobutane cross-linked polymer of equation 7 wherein $R^1$ is hydrogen, wherein $R^2$ is methyl, wherein R is a bivalent phenyl radical, and wherein $R^4$ is methyl, wherein M is Si and x has a value such that the polymer has a molecular weight of 5000. Axis 40 is percent weight. Axis 42 is temperature in degrees centigrade. Curve 44 is for heating the sample in an atmosphere of nitrogen and curve 46 is for heating the sample in atmospheric oxygen. For heating in nitrogen, there is no appreciable change in the polymer until after the polymer is heated above about 500° C. For the sample heated in air there is no appreciable change in the polymer until the sample is heated above about 400° C. For the compounds described herein as etch barriers there is generally no expected appreciable change until heated above 350° C.

Figure 12:
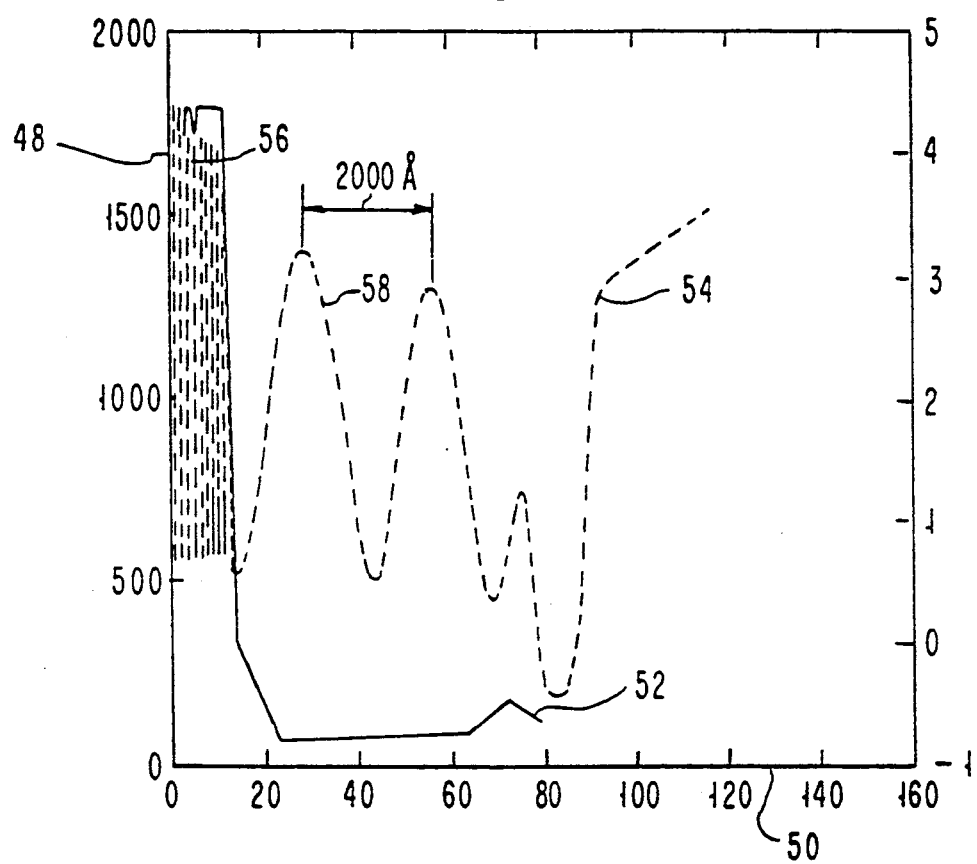
FIG. 12 is a plot of the etch rate of the polymer of FIG. 11.

FIG. 12 shows the result of etching a sandwich structure. The polymer having the TGA data of FIG. 11 is sandwiched between two PMDA-ODA polyimide layers. The sandwich structure was baked at 360° C. to cure all the polyimide layers. In the preferred embodiments R, $R^1$, $R^2$, $R^4$, $R^5$, $R^6$, $R^7$, $R^9$ and $R^{10}$ are as defined as follows:

The polyimide layers were 2 microns each and the silylphenylene layer was 0.6 microns. The etch is an $O_2/CF_4$ (2% $CF_4$) plasma. FIG. 12 shows the etch data with axis 48 being the etch rate in angstroms per minute and axis 50 being the etched time in minutes. Curve 52 corresponds to the etch as a function of time, curve 54 is a laser interferometer measurement to determine the etch rate. The distance between two peaks of curve 54 is 2000 angstroms as shown in the figure. There is about a 20:1 etch ratio between the polyimide represented by region 56 and the etch barrier represented by region 58.

In the preferred embodiments R, $R^1$, $R^2$, $R^4$, $R^5$, $R^6$, $R^7$, $R^9$, and $R^{10}$ are defined as follows:

R is preferably phenylene, most preferably a bivalent phenyl radical;

$R^1$ is preferably H or lower alkyl having from 1 to 10 carbon atoms; most preferably H;

$R^2$ is preferably lower alkyl and alkenyl having from 1 to 10 carbon atoms, aryl having from 1 to 3 benzene rings and siloxy radicals, most preferably methyl;

$R^4$ is preferably H, lower alkyl and alkenyl having from 1 to 10 carbon atoms, aryl having from 1 to 3 benzene rings and a silyl radical, most preferably methyl;

$R^5$ is preferably H, lower alkyl and alkenyl having from 1 to 10 carbon atoms, and aryl having from 1 to 3 benzene rings; most preferably methyl;

$R^6$, $R^7$ and $R^9$ are preferably lower alkyl and alkenyl having from 1 to 10 carbon atoms and aryl having from 1 to 3 benzene rings, most preferably methyl;

$R^{10}$ is preferably lower alkenyl having from 1 to 10 carbon atoms, most preferably ethylene.

EXAMPLES

Example 1

22.6 gm p(bis-hydroxydimethylsilyl)benzene were dissolved in 200 ml toluene, 32 g pyridine were added and then 19.1 gm of 1,1-dichloro-1-silacyclobutane were added to the solution at room temperature under stirring conditions. The reaction mixture was filtered after 17 hours (at 20° C.) to remove the precipitate (Py.HCl salt) and then poured into methanol (10% $H_2O$). The bottom layer of the polysilphenylene copolymer was separated, kept under vacuum (150 mm, 100° C., for 2 hours) to remove all volatile compounds, filtered and used as an etch barrier. Molecular weight (GPC data was $2,2.10^4$) dispersivity, $2,0_0$ the oligomer contains app. 28.6% Si, the etch rate in $O_2$ ($CF_4$) plasma was 60 Å/min at 200 m Torr. TGA data show that no degradation occurs up to 400° C.

Example 2

Example 1 is repeated except that 1,3-dichloro-1,3 dimethyl-1,3-disilacyclobutane is used instead of 1,1-dichloro-1-silacyclobutane.

Example 3

Example 1 is repeated except that 1,1-dichloro-3,3-dimthyl-1,3-disilacyclobutane is used instead of 1,1-dichloro-1-silacyclobutane.

Example 4

Example 1 is repeated except that 1,1-dichloro-2,3-benzo-1-silacyclobutene is used instead of 1,1-dichloro-1-silacyclobutane.

Example 5

Example 1 is repeated except that 1,1-dichloro-3-methyl-1-silacyclobutane is used instead of 1,1-dichloro-1-silacyclobutane.

Example 6

Example 1 is repeated except that 1,1-dichloro-2-phenyl-1-silacyclobutane is used instead of 1,1-dichloro-1-silacyclobutane.

Example 7

Example 1 is repeated except that 1,1-dichloro-3,3-diphenyl-1,3-disilacyclobutane is used instead of 1,1-dichloro-1-silacyclobutane.

Example 8

Example 1 is repeated except that 1,1-dichloro-1-germacyclobutane is used instead of 1,1-dichloro-1-silacyclobutane.

Example 9

Example 1 is repeated except that 1,1-dichloro-3,3-dimethyl-1-sila-3-germacyclobutane is used instead of 1,1-dichloro-1-silacyclobutane.

Example 10

Example 1 is repeated except that a mixture of three comonomers, p(bis-hydroxy-dimethylsilylbenzene) (22.6 g), dimethyldichlorosilane (12.9 g) and 1,1-dichloro-1-silacyclobutane (1.41 g) was used in combination with pyridine (32 g).

Example 11

Example 10 was repeated except that triethylamine was used in stead of pyridine. Reaction time was 60 minutes.

Example 12

Example 1 is repeated except that a mixture of four comonomers, p(bis-hydroxydimthylsilyl), benzene (27.6 g), dimethyldichlorosilane (12.9 g), 1,1-dichloro-1-silacyclobutane (1.41 g) and trimethylchlorosilane (molecular weight regulator) (1 g) was used.

Example 13

Example 1 is repeated except that diethyl ether was used as a solvent which was removed at 50° C. (150 mm Hg vacuum, for 2 hours).

Example 14

The oligomer at example 1 was spin-coated on top of imidized polyimide Du Pont Pyrelene 5878. After baking at 170° C. for 60 minutes it forms a cross-linked product.

While the invention has been illustrated and described with respect to preferred embodiments, it is to be understood that the invention is not limited to the precise constructions therein disclosed, and that the right is reserved to all changes and modifications coming within the scope of the invention as defined in the appended claims.

Having thus described our invention, what we claim as new and desire to secure by Letters Patent is:

1. A structure comprising:
   a dielectric body;
   a polymeric body embedded within said dielectric body; said polymeric body containing an aromatic constituent containing at least one atom selected from the group of Si and Ge; said polymeric body containing a cross-linking agent selected from the group consisting of a metallocyclobutane group and a vinyl group; said metallocyclobutane group and said vinyl group containing at least one atom selected from the group consisting of Si and Ge.

2. The structure of claim 1, further including an electrical conductor embedded in said dielectric body.

3. The structure of claim 2, wherein there are gaps between at least a part of said electrical conductor and said dielectric body, said gaps being substantially filled with a part of said polymeric body.

4. The structure of claim 1, wherein said dielectric body is a polymeric material.

5. The structure of claim 4, wherein said polymeric material is a polyimide material.

6. The structure of claim 1, wherein said dielectric body chemically adheres to said polymer body.

7. The structure of claim 2 wherein said electrical conductor is selected from the group consisting of Au, Ag, Mo, Al, Cu, Cr, Co and alloys thereof.

8. The structure of claim 1, wherein said polymeric body is a layer embedded within said dielectric body.

9. The structure of claim 2, further including an electronic device electrically connected to the conductor patter in said body.

10. The structure of claim 1 wherein said polymeric body is a cross linked form of a compound having structural formula:

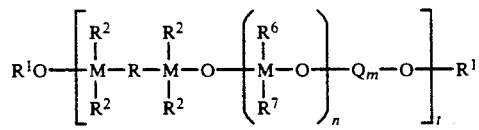

wherein Q is selected from the group consisting of groups having structural formula:

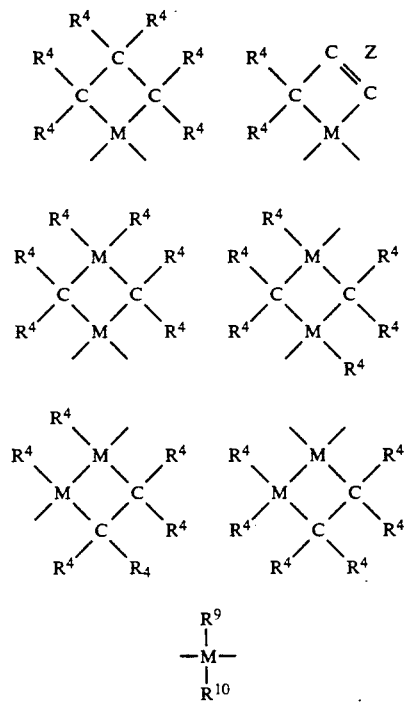

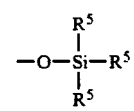

where R is a divalent aromatic radical;
wherein $R^1$ is selected from the group consisting of H, alkyl, aryl and alkenyl radicals;
wherein each $R^2$ is selected from the group consisting of alkyl radicals, aryl radicals, alkenyl radicals and siloxy radicals having structural formula:

$$-O-\underset{\underset{R^5}{|}}{\overset{\overset{R^5}{|}}{Si}}-R^5$$

wherein each $R^4$ is selected from the group consisting of H, alkyl radicals, aryl radicals, alkenyl radicals and silyl radicals having structural formula:

$$-\underset{\underset{R^5}{|}}{\overset{\overset{R^5}{|}}{Si}}-R^5$$

wherein each $R^5$ is selected from the group of H, alkyl, aryl and alkenyl radicals;

wherein $R^6$ is selected from the group consisting of alkyl, aryl and alkenyl radicals;

wherein $R^7$ is selected from the group consisting of alkyl, aryl and alkenyl radicals;

wherein $R^9$ is selected from the group consisting of alkyl, aryl and alkenyl radicals;

wherein $R^{10}$ is selected from the group consisting of alkenyl radicals;

wherein Z is selected from the group consisting of aromatic radicals, wherein Z forms a six number carbon ring with the two $R^4$ to which it is bonded;

wherein each M is selected from the group consisting of Si, and Ge atoms;

wherein t has a value such that said compound has a molecular weight from about 1,000 to about 30,000;

wherein m is at least 1; and wherein n is greater than or equal to 0.

11. The structure of claim 2, wherein the terminal $OR^1$ groups of said compound are substituted by groups having the structural formula:

wherein $R^8$ is selected from alkyl and an aryl group.

12. The structure of claim 10, wherein R is selected from the group consisting of divalent phenylene, naphthalene, anthracene, adamantine, ferrocene and carborane radicals.

13. The structre of claim 1, wherein said polymeric body is a reaction producte of p(bis-hydroxydimethylsilyl)benzene and at least one member selected from the group consisting of 1,1-dichloro-1-silacyclobutane, 1,3-dichloro-1,3-dimethyl-1,3-disilacyclobutane, 1,1-dichloro-3,3,dimethyl-1,3-disilacyclobutane, 1,1-dichloro-2,3-benzo-1-silacyclobutene, 1,1-dichloro-3-methyl-1-silacyclobutane, 1,1-dichloro-2-phenyl-1-silacyclobutane, 1,1-dichloro-3,3-diphenyl-1,3-disilacyclobutane, 1,1-dichloro-1-germacyclobutane and 1,1-dichloro-3,3-dimethyl-1-sila-3-germacyclobutane.

14. The structure of claim 1, wherein said polymeric body is a reaction product of p(bis-hydroxy-dimethylsilylbenzene), dimethyldichlorosilane and 1,1-dichloro-1-silacyclobutane.

15. The structure of claim 1, wherein said polymeric body is a reaction product of p(bis-hydroxydimethylsilyl)benzene, dimethyldichlorosilane, 1,1-dichloro-1-silacyclobutane and trimethylchlorosilane.

* * * * *